(12) United States Patent
Walker et al.

(10) Patent No.: US 7,788,613 B2
(45) Date of Patent: *Aug. 31, 2010

(54) BORDER-ENHANCED SLIDING WINDOW SCHEME (SWS) FOR DETERMINING CLOCK TIMING IN A MESH-BASED CLOCK ARCHITECTURE

(75) Inventors: William W. Walker, Los Gatos, CA (US); Subodh M. Reddy, Sunnyvale, CA (US); Rajeev Murgai, Santa Clara, CA (US)

(73) Assignee: Fujitsu Limited, Kawasaki (JP)

( * ) Notice: Subject to any disclaimer, the term of this patent is extended or adjusted under 35 U.S.C. 154(b) by 272 days.

This patent is subject to a terminal disclaimer.

(21) Appl. No.: 11/428,995

(22) Filed: Jul. 6, 2006

(65) Prior Publication Data
US 2007/0038430 A1  Feb. 15, 2007

Related U.S. Application Data

(60) Provisional application No. 60/697,110, filed on Jul. 6, 2005.

(51) Int. Cl.
*G06F 17/50* (2006.01)
(52) U.S. Cl. .............................. 716/5; 716/6
(58) Field of Classification Search ............ 716/4–6
See application file for complete search history.

(56) References Cited

U.S. PATENT DOCUMENTS

| | | | |
|---|---|---|---|
| 6,205,571 | B1 | 3/2001 | Camporese et al. |
| 6,745,377 | B2 * | 6/2004 | Baumgartner et al. .......... 716/6 |
| 7,089,443 | B2 | 8/2006 | Albonesi et al. |
| 7,301,385 | B2 | 11/2007 | Takano et al. |
| 7,392,495 | B1 * | 6/2008 | Cherukupalli et al. ......... 716/10 |
| 2007/0016882 | A1 * | 1/2007 | Chen et al. ..................... 716/6 |
| 2007/0038430 | A1 * | 2/2007 | Walker et al. ................. 703/14 |

OTHER PUBLICATIONS

Bailey et al., "Clocking Design and Analysis for a 600 MHz Alpha Microprocessor," IEEE Journal of Solid State Circuits, vol. 33, No. 11, pp. 1627-1633, Nov. 1998.

(Continued)

*Primary Examiner*—Jack Chiang
*Assistant Examiner*—Binh C Tat
(74) *Attorney, Agent, or Firm*—Baker Botts L.L.P.

(57) ABSTRACT

In one embodiment, a method includes accessing a description of a chip including multiple sequential elements and a clock mesh, information for modeling the sequential elements and interconnections, and a set of parameters of the clock mesh. The method also includes, using the description of the chip, the information for modeling the sequential elements and interconnections, and the set of parameters of the clock mesh, determining multiple original window locations covering the clock mesh. Each window location includes one or more of the sequential elements on the chip. The method also includes, for each original window location, expanding the original window location in one or more directions to generate a larger window location and generating a mesh simulation model including a detailed model inside the larger window location and an approximate model outside the larger window location, simulating the mesh simulation model, and measuring clock timing for the sequential elements in the window location based on the mesh simulation model. The method also includes collecting timing information on the sequential elements on the chip based on the measured clock timing for the sequential elements in the original window locations.

6 Claims, 5 Drawing Sheets

OTHER PUBLICATIONS

Chiprout, "Fast Flip-Chip Power Grid Analysis Via Locality and Grid Shells," ICCAD, pp. 485-488, 2004.

Desai et al., "Sizing of Clock Distribution Networks for High Performance CPU Chips," DAC, Jun. 1996.

Dobberpuhl et al., "A 200 MHz 64-b Dual-Issue CMOS Microprocessor," IEEE Journal of Solid State Circuits, vol. 27, No. 11, pp. 1555-1567, Nov. 1992.

Feldman et al., "Efficient Linear Circuit Analysis by Pade' Approximation Via the Lanczos Process," IEEE Transactions on CAD, pp. 639-649, May 1995.

Freund, "SPRIM: Structure-Preserving Reduced-Order Interconnect Macromodeling," ICCAD, pp. 80-87, Nov. 2004.

Heald et al., "WP 25.2 Implementation of a 3rd-Generation SPARC V9 64b Microprocessor," ISSCC Dig. Tech. Papers, pp. 412-413, Feb. 2000.

Northrop et al., "MP5.2 A 600-MHz G5 S/390 Microprocessor," ISSCC Tech Dig., pp. 88-89, Feb. 1999.

Odabasioglu et al., "PRIMA: Passive Reduced-Order Interconnect Macromodeling Algorithm," IEEE Transaction on CAD, pp. 645-654, Aug. 1998.

Pillage et al., "Asymptotic Wave-Form Evaluation for Timing Analysis," IEEE Transaction son Computer-Aided Design, pp. 352-366, Apr. 1990.

Restle et al., "8.4 The Clock Distribution of the Power4 Microprocessor," ISSCC Dig. Tech. Papers, pp. 144-145, Feb. 2002.

Vandenberghe et al., "Optimal Wire and Transistor Sizing for Circuits with Non-Tree Topology," ICCAD, pp. 252-259, 1997.

* cited by examiner

COMPLETE MESH

BORDER-ENHANCED SLIDING WINDOW SCHEME (SWS) FOR DETERMINING CLOCK TIMING IN A MESH-BASED CLOCK ARCHITECTURE

RELATED APPLICATION

This application claims the benefit under 35 U.S.C. §119 (e) of U.S. Provisional Application No. 60/697,110, filed Jul. 6, 2005.

TECHNICAL FIELD OF THE INVENTION

This invention relates in general to designing integrated circuits (ICs) and more particularly to determining clock timing in a mesh-based clock architecture.

BACKGROUND OF THE INVENTION

Mesh architectures often distribute critical global signals on a chip such as clock and power/ground. Redundancy created by loops present in a mesh tends to smooth out undesirable variations between signal nodes spatially distributed over the chip. However, accurate analysis of a mesh architecture is difficult.

BRIEF DESCRIPTION OF THE DRAWINGS

To provide a more complete understanding of the present invention and features and advantages thereof, reference is made to the following description, taken in conjunction with the accompanying drawings, in which.

DESCRIPTION OF EXAMPLE EMBODIMENTS

Figure 1:
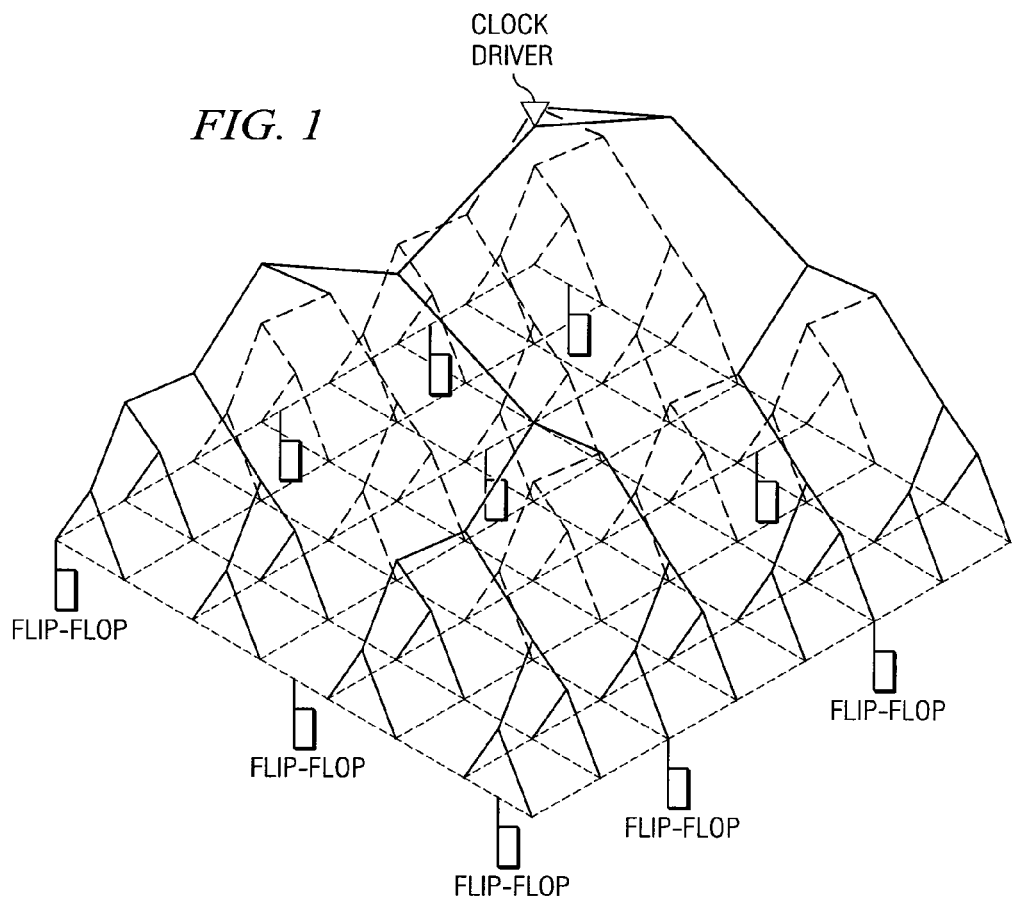
FIG. 1 illustrates an example clock mesh architecture.

FIG. 1 illustrates an example clock mesh architecture. Mesh (or grid) architectures often distribute critical global signals on a chip, such as, for example, clock and power/ground. The mesh architecture uses redundancy created by loops to smooth out undesirable variations between signal nodes spatially distributed over the chip. These variations can be due to non-uniform switching activity in the design, within-die process variations and asymmetric distribution of circuit elements, such as, for example, flip-flops (FFs). For power/ground, mesh can help reduce voltage variations at different nodes in the network due to non-uniform switching activities. For the clock signal, a mesh (such as the example mesh illustrated in FIG. 1) may achieve very low skew in microprocessor designs, e.g., Digital 200-MHz Alpha and 600-MHz Alpha; IBM G5 S/390, Power4, and PowerPC; and SUN Sparc V9. Mesh also has desirable jitter mitigation properties.

However, a problem that has limited the applicability of mesh architectures is the difficulty of analyzing them with sufficient accuracy. Reasons for this difficulty include the large number of circuit nodes needed to accurately model a fine mesh in a large design and the large number of metal loops present in the mesh structure. As a result, circuit simulators such as SPICE either require a large amount of memory, a long run-time, or both.

Particular embodiments provide a scheme (called herein a sliding-window scheme (SWS)) for analyzing clock meshes. Particular embodiments accurately compute the clock arrival time at the clock input pin of each FF. In particular embodiments SWS is substantially accurate, requires substantially less memory, and may analyze large industrial designs in a relatively short amount of time. In particular embodiments SWS is also easily amenable to distributed (or grid) computing. Particular embodiments provide effective solutions to problems associated with traditional clock mesh analysis. Particular embodiments facilitate the use of clock mesh architectures in application-specific integrated circuit (ASIC) and processor design.

Figure 2:
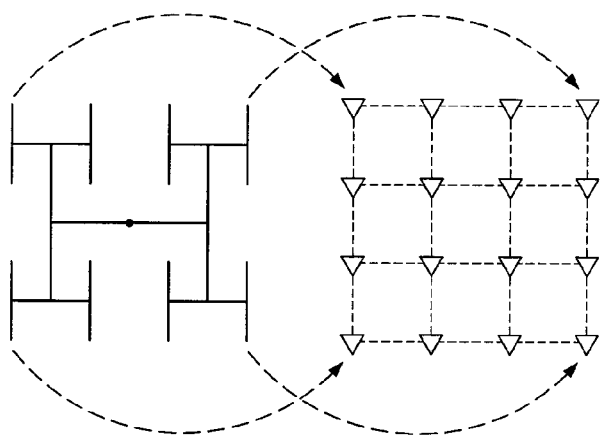
FIG. 2 illustrates an example connection of a global H-tree to a mesh.

The mesh architecture illustrated in FIG. 1 may distribute a clock signal from a phase-locked loop (PLL) or root buffer to sequential elements, such as, for example, FFs and latches on a chip. The mesh architecture illustrated in FIG. 1 has three main components: a uniform mesh, a global tree that drives the mesh, and a local interconnect, where the clock inputs of FFs connect directly to the nearest point on the mesh. Although a uniform mesh is illustrated and described, the present invention contemplates nonuniform meshes, as well as uniform meshes. The mesh illustrated in FIG. 1 is a uniform rectangular grid of wires spanning the entire chip area (or the smallest rectangular region spanned by FFs) driven by the mesh buffers and propagating the clock to the FFs. An m×n mesh has m rows (horizontal wires) and n columns (vertical wires). The size of a mesh stands for m×n. For a given chip size, the greater the mesh size, the more fine-grain the mesh. A mesh node (or grid node) is the point where each row is connected to each column. FIG. 2 illustrates an example connection of a global H-tree to a mesh. The global tree delivers the clock signal to the mesh nodes via buffers called mesh buffers. Assume a uniform array of k×l mesh buffers. In FIG. 2, k=m=4 and l=n=4. The mesh wire between two adjacent mesh nodes is called a mesh segment.

In a clock distribution scheme, a concern is to accurately compute the clock arrival time a (also called clock delay or latency) at the clock input pin of each FF. Assume a path P in a design having start and end gates that are FFs $F_s$ and $F_e$, respectively. Let clock arrival times at these FFs be $a_s$ and $a_e$, respectively. The maximum delay $d_{max}$ allowed on P is a function of $a_e - a_s$, the difference in clock arrival times at the two FFs.

$$d_{max} \leq a_e - a_s + \tau - t_{set\_up} \quad (1)$$

where $\tau$ is the clock cycle and $t_{set\_up}$ is the set-up time for $F_e$. $a_e - a_s$ is the skew between $F_s$ and $F_e$. By comparing the arrival times among all FFs, the worst relevant clock skew in the design may be computed. This is the maximum difference in arrival times at two FFs connected to each other by a data path. The worst skew impacts the maximum operating frequency for the design, since it limits the maximum delay in the data path.

Traditional static timing analysis (STA) techniques typically assume an acyclic underlying structure for the logic and interconnect and cannot handle loops present in the clock mesh. Moreover, industry-standard STA tools usually have up to a 15% difference vis-à-vis SPICE with respect to cell and interconnect delays. Such a large inaccuracy in timing is unacceptable for the clock signal. As a result, particular embodiments use SPICE for accurate timing analysis of the clock mesh.

It is relatively straightforward and fast to compute the latency on the global tree. Particular embodiments address only the mesh timing-analysis problem. The same clock signal may be assumed to drive all mesh buffers. It may be assumed that the design is already placed and FF locations are known. Particular embodiments accurately compute the arrival time of the rising edge of the clock at each FF.

Figure 3:
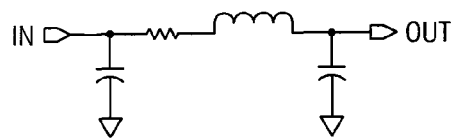
FIG. 3 illustrates an example single-$\pi$ model of a wire.
Figure 4:
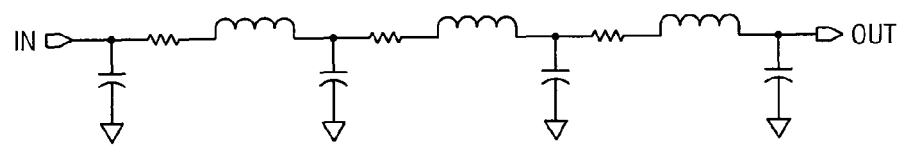
FIG. 4 illustrates an example 3-$\pi$ model of a wire.

In particular embodiments, wires compose a mesh. In such embodiments, an accurate wire model for the mesh is important. To model wires smaller than approximately 100μ, particular embodiments use a single-π model, which has two capacitors, a resistor, and an inductor. FIG. 3 illustrates an example single-π model. For longer wires, particular embodiments use a 3-π model. FIG. 4 illustrates an example three-π model. In particular embodiments, such a scheme may provide accuracy to within approximately 0.5% of 4-π and 5-π models, while helping to reduce the number of nodes in the SPICE model. Particular embodiments use the same rule to model the wires that connect FFs to the mesh. Particular embodiments model the clock pin of a FF as a simple equivalent capacitance.

The use of a mesh is often limited by difficulties associated with analyzing the mesh. SPICE simulations may be performed to analyze the mesh, but SPICE analysis often fails on clock meshes for chip-level circuits, such as, for instance, a 64×64 mesh for a circuit with 100K FFs. Such simulations may run out of memory or require excessive CPU time for one or both of the following reasons:

1. Model size: Due to importance of the interconnect in determining path delays, interconnect should be modeled accurately. Each mesh wire segment contributes three nodes if a single-π model is used, and seven nodes for a 3-π model. Similarly, each FF is a node and its connection point to the mesh is one node. Thus, just the mesh and the local FF connections can contribute hundreds of thousands of nodes in the SPICE model. SPICE runs of memory when generating the model or the run-time requirements are excessive, since the run-time of SPICE grows as $O(N^p)$, where N is the number of nodes in the model and $1<p<2$.
2. Due to a large number of cycles and redundancy present in the mesh structure, simulation of the mesh by a circuit simulator is excessively time consuming.

In particular embodiments, a method (called herein SWS) analyzes latency in clock distribution networks involving meshes. In particular embodiments, SWS is based on the observation that for each signal source, e.g., the mesh buffer, the clock mesh can be deemed a cascaded low-pass RC filter. For this RC filter, the attenuation of a ramp input signal is proportional to the exponential of the distance. Because of this exponential attenuation, if two nodes are geometrically far, they have relatively little electrical impact on each other. This phenomenon allows some of the circuit details that are geometrically distant from the node to be ignored. In particular embodiments, the mesh is modeled with two different resolutions: a detailed circuit model is used for mesh elements geometrically close to the nodes being measured; and a simplified model is used for mesh elements far from the nodes being measured. The simplification is with respect to the local FF connections.

Figure 5:
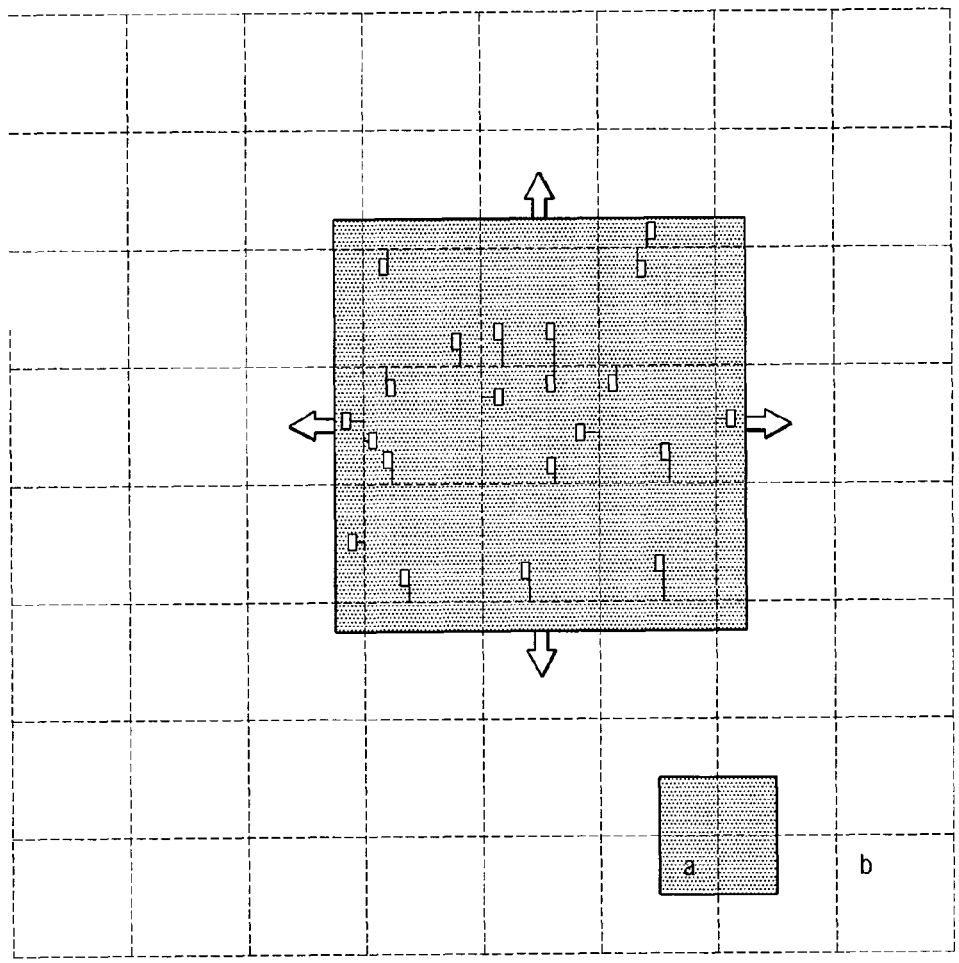
FIG. 5 illustrates an example window.

In particular embodiments, SWS works as follows. Given a mesh of size m×n, SWS defines a rectangular window W of size r×s, where r<m and s<n. If the lower left corner of W is fixed to a point on the mesh, W covers some fixed region of the mesh, as illustrated by way of example only and not by way of limitation in FIG. 5. In particular embodiments, details of the circuit are substantially preserved inside W. As an example and not by way of limitation, the connection of a FF within W to the nearest mesh segment may be modeled accurately by an appropriate π model, as described above: single-π or 3-π, depending on the length of the connection. The clock input pin of the FF may be modeled as a capacitance. If there are f FFs connected to a mesh segment, the mesh segment may be divided into f+1 sub-segments. Each sub-segment may be modeled with an appropriate π model. In particular embodiments, FFs that lie outside W and their connections to the mesh are modeled approximately. As an example and not by way of limitation, a wire connecting such a FF to the mesh may be replaced by an equivalent single capacitance. Wire resistance may be ignored. Given a mesh node a outside W, the region covered by a is the unit rectangle shown in FIG. 5. Let $C_a$ be the sum of the clock input pin capacitances of all the FFs in this region along with the capacitances of the wires connecting them to the mesh. $C_a$ may be lumped together as a single capacitance at a. The mesh segments outside W may be modeled with appropriate π models. The SPICE file corresponding to this model for the window location may be generated and simulated, and the clock latencies at all FFs in W may be measured. The window may then be slid horizontally or vertically so as not to overlap with the previous locations. A SPICE model may again be created and run. Simulating the entire mesh may thus be broken down into multiple window-based simulations. In fact, $$\left\lceil \frac{m-1}{r-1} \right\rceil * \left\lceil \frac{n-1}{s-1} \right\rceil$$

Figure 6:
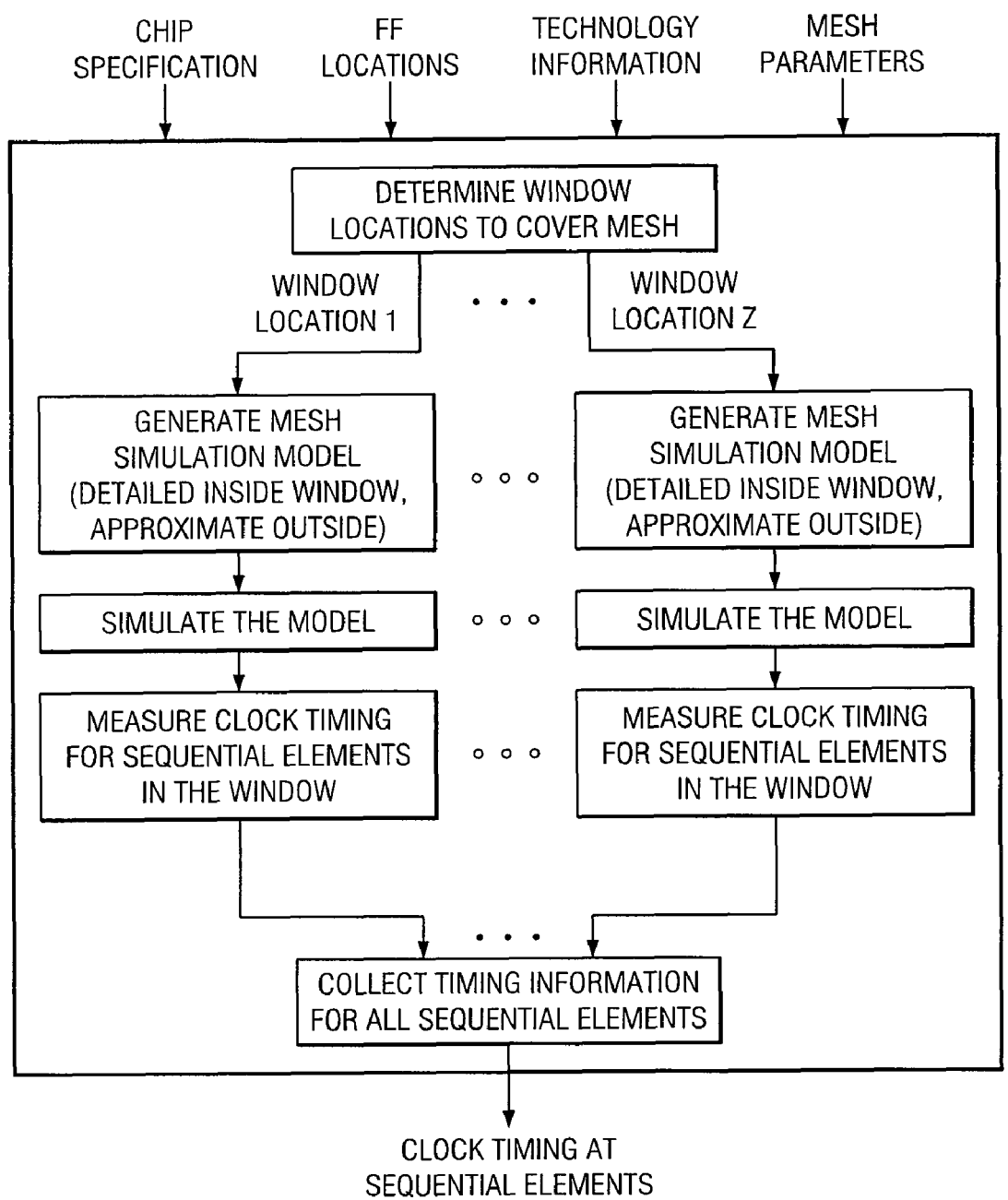
FIG. 6 illustrates an example method for SWS-based clock mesh analysis.

SPICE simulations may be needed to cover the entire mesh and thus all the FFs in the design. FIG. 6 illustrates an example method for SWS-based clock mesh analysis.

Particular embodiments of SWS can complete on fine meshes and are accurate to within approximately 1% of the complete mesh simulation. Particular embodiments are also well suited to parallelization or grid computing, since different SPICE simulations are independent of each other.

Particular embodiments of SWS use a divide-and-conquer partitioning technique. Approximating the region outside the window reduces the number of nodes in the circuit model. Approximating each FF saves seven nodes if the wire is longer than 100μ or three nodes otherwise. In a typical design, where there are hundreds of thousands of FFs, the reduction in the size of the SPICE model can be significant. Such embodiments also obtain CPU speed-up as well, as the following example illustrates.

By way of example and not by way of limitation, assume a 65×65 mesh and a design with 100K FFs. Also assume that these FFs are uniformly distributed over the chip. Assume that all the wires and mesh segments are modeled with a single-π model. Let $N_g$ be the number of nodes in the golden model, which is obtained when all FFs and their clock pin wires are modeled accurately. Each mesh segment is modeled with the single-π model and has two nodes, as illustrated in FIG. 3. The number of mesh nodes is 65×65, and the number of mesh segments is 64×65×2, counting both horizontal and vertical segments. Given that adjacent segments share a node, the total number of SPICE nodes due to mesh segments is (65×65)+ (64×65×2)=12545. Each FF contributes three nodes: one for the FF, one for the point where it couples to the mesh, and one internal node in the π model. Thus, FFs contribute about 300K nodes. So $N_g \sim 312K$.

By using a window W of size 17×17, for a given location of W, let the number of nodes in the SPICE model be $N_W$. As before, the mesh segments will contribute approximately 12K nodes to the model. However, only about 1/16 of the total FFs lie in W. Then, only 7K FFs are modeled accurately. They contribute 21K nodes. The FFs outside W do not contribute any additional nodes, since they are lumped at the nearest mesh node. So $N_W \sim 33K$. Thus, SWS achieves almost a 10×reduction in the model size.

To estimate the run-time of SWS, assume that the SPICE run-time is $O(N^{1.5})$. Since the number of nodes reduces by a factor of 10, each window simulation is about $10^{1.5}=32$ times faster than the "golden" model simulation. A total of 16 simulations are required to cover the entire mesh. Thus we can expect an overall speed-up of approximately 2 for sequential execution on a single machine and a speed-up of approximately 32 for parallel execution, assuming 16 machines are available.

Figure 7:
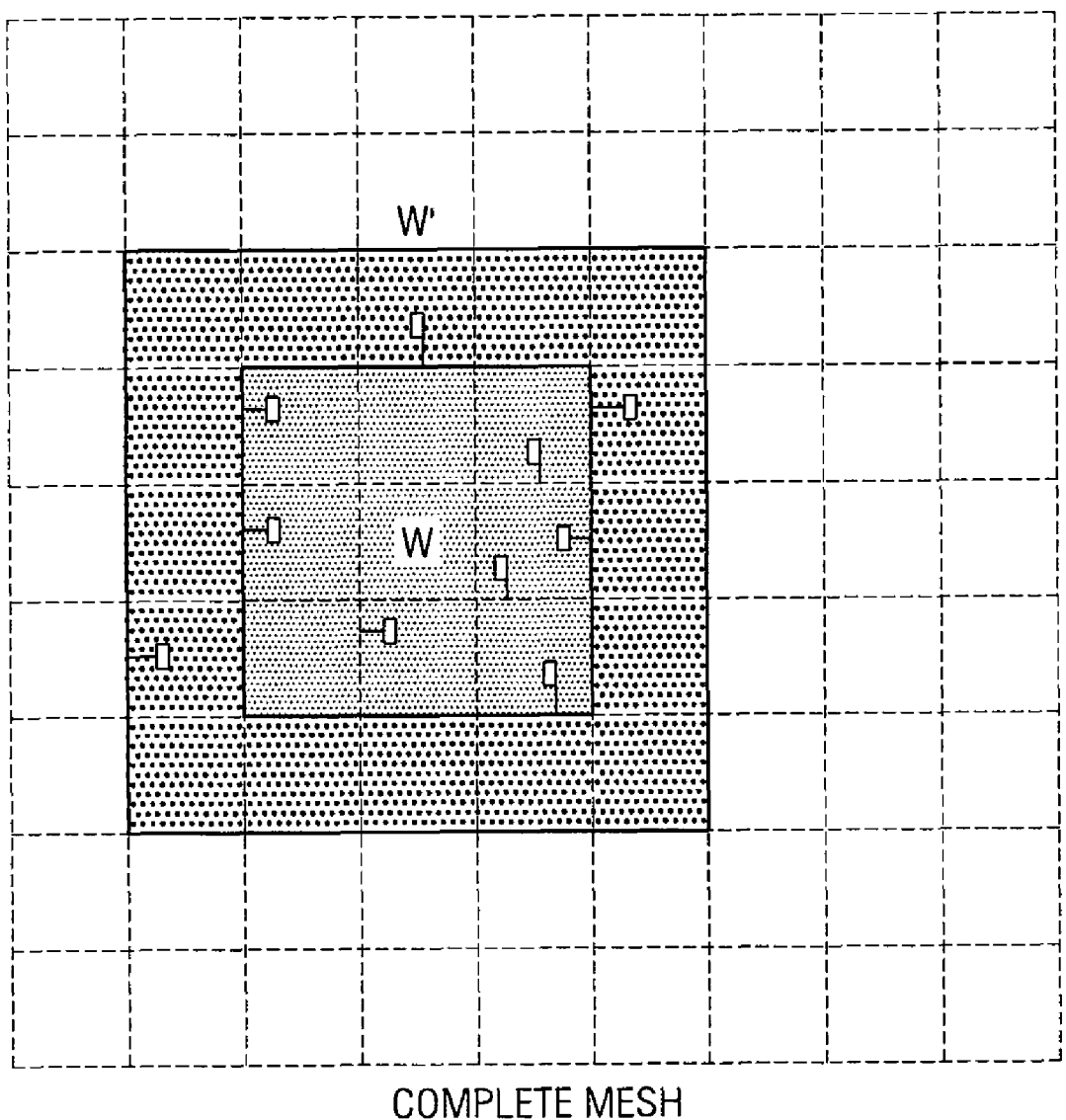
FIG. 7 illustrates an example window with an example border.
Figure 8:
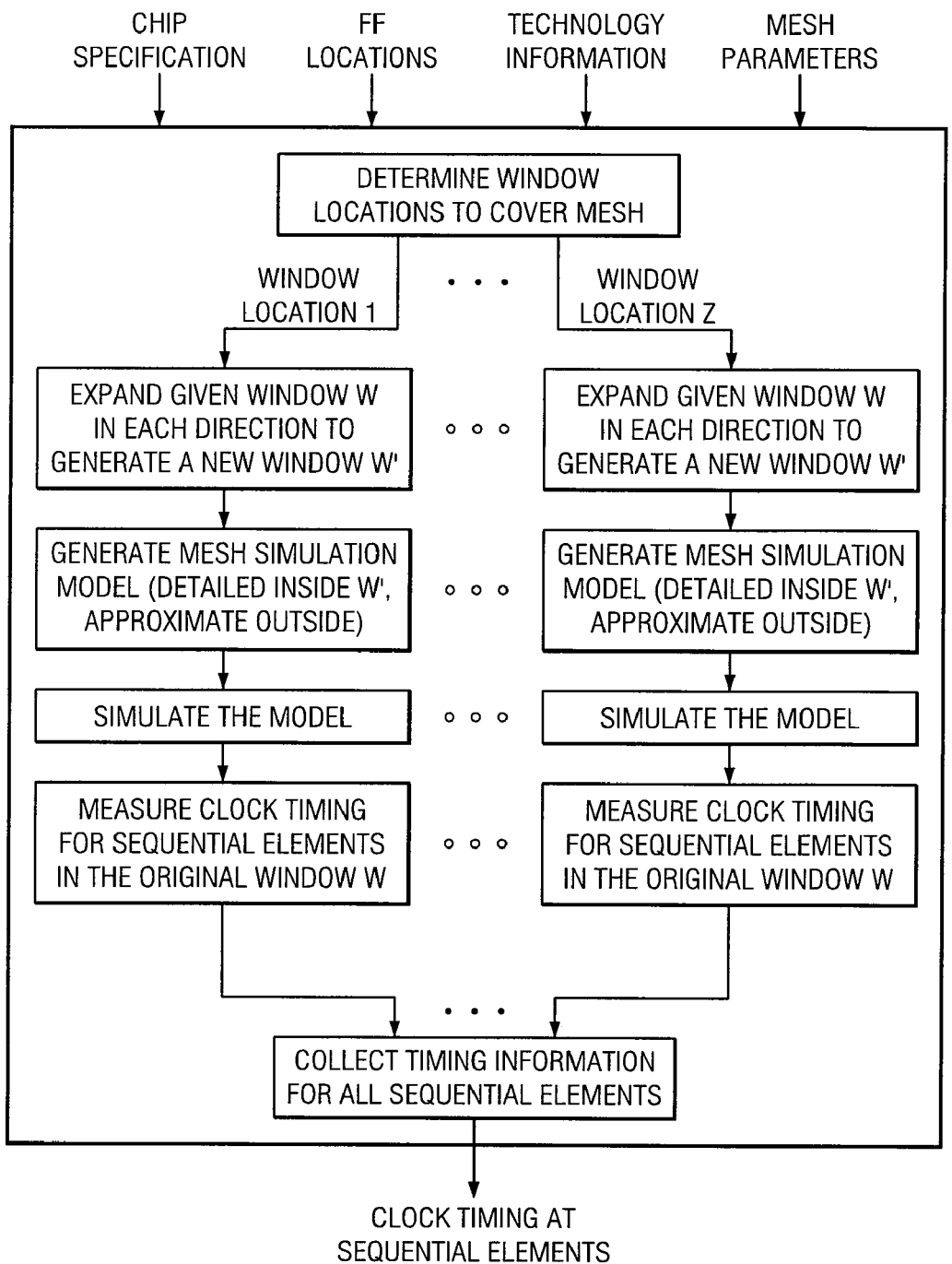
FIG. 8 illustrates an example method for applying border-enhanced SWS to clock-mesh analysis

FFs with large latency errors may tend to be close to the window boundary. In particular embodiments, SWS accuracy improves when the latencies of FFs on the border are ignored. SWS may be enhanced by expanding the original window W to W' by including a border around W, as illustrated in FIG. 7. The window W' is modeled accurately. However, the clock latencies are measured only for the FFs in the original window W. The latencies for FFs in W'-W will be measured when they fall within the core of another appropriate window. FIG. 8 illustrates an example method for applying border-enhanced SWS to clock mesh analysis.

Particular embodiments have been used to describe the present invention, and a person having skill in the art may comprehend one or more changes, substitutions, variations, alterations, or modifications within the scope of the appended claims. The present invention encompasses all such changes, substitutions, variations, alterations, and modifications.

What is claimed is:

1. A method comprising:
   accessing by one or more computer systems:
      a description of a chip comprising a plurality of sequential elements and a clock mesh, the description identifying the sequential elements, indicating locations of the sequential elements on the chip, specifying interconnections among the sequential elements on the chip, and specifying a layout of the chip;
      information for modeling the sequential elements and interconnections; and
      a set of parameters of the clock mesh;
   using the description of the chip, the information for modeling the sequential elements and interconnections, and the set of parameters of the clock mesh:
      determining by the one or more computer systems a plurality of original window locations covering the clock mesh, each original window location comprising one or more of the sequential elements on the chip; and
      for each original window location:
         expanding by the one or more computer systems the original window location in one or more directions to generate a larger window location;
         generating by the one or more computer systems a mesh simulation model comprising a detailed model and an approximate model, the detailed model detailing all components inside the larger window location and the approximate model approximating all components outside the larger window location;
         simulating by the one or more computer systems the mesh simulation model; and
         measuring by the one or more computer systems clock timing for the sequential elements in the original window location based on the simulation of the mesh simulation model; and
   collecting by the one or more computer systems timing information on all the sequential elements on the chip based on the measured clock timing for the sequential elements in the original window locations.

2. The method of claim 1, wherein two or more of the original window locations are processed in parallel with each other.

3. The method of claim 1, wherein an architecture of the clock mesh comprises a single mesh or a plurality of meshes.

4. The method of claim 1, wherein an architecture of the clock mesh comprises a global tree.

5. The method of claim 1, wherein an architecture of the clock mesh comprises a local distribution that comprises either a direct connection to each sequential element on the chip or a plurality of local trees.

6. The method of claim 1, wherein:
   the detailed model inside the larger window location comprises an explicit representation of a connection to each sequential element in the larger window location, the explicit representation comprising an accurate interconnection model; and
   the approximate model outside the larger window location comprises nonexplicit representations of connections to sequential elements outside the larger window location, each nonexplicit representation comprising a plurality of connections to a plurality of sequential elements outside the larger window location grouped together for modeling.

* * * * *